United States Patent [19]
Ooba et al.

[11] Patent Number: 4,794,597
[45] Date of Patent: Dec. 27, 1988

[54] MEMORY DEVICE EQUIPPED WITH A RAS CIRCUIT

[75] Inventors: Kunio Ooba; Tooru Kojima, both of Hyogo, Japan

[73] Assignee: Mitsubishi Denki Kabushiki Kaisha, Tokyo, Japan

[21] Appl. No.: 945,530

[22] Filed: Dec. 23, 1986

[30] Foreign Application Priority Data

Mar. 28, 1986 [JP] Japan .................................. 61-71462
Mar. 28, 1986 [JP] Japan .................................. 61-71463
Mar. 28, 1986 [JP] Japan .................................. 61-71464

[51] Int. Cl.⁴ .............................................. G06F 11/10
[52] U.S. Cl. ............................................ 371/3; 371/13
[58] Field of Search ............................. 371/3, 13, 38

[56] References Cited

U.S. PATENT DOCUMENTS

| | | | |
|---|---|---|---|
| 3,257,546 | 6/1966 | McGovern | 371/3 |
| 3,405,258 | 10/1968 | Goody et al. | 371/3 |
| 3,465,132 | 9/1969 | Crockett et al. | 371/3 |
| 3,491,337 | 1/1970 | Guzak, Jr. et al. | 371/3 |
| 3,688,265 | 8/1972 | Carter et al. | 371/3 |
| 4,493,081 | 1/1985 | Schmidt | 371/38 |
| 4,506,362 | 3/1985 | Morley | 371/13 |
| 4,561,095 | 12/1985 | Khan | 371/38 |

FOREIGN PATENT DOCUMENTS

56-156996 12/1981 Japan .
60-37934 8/1985 Japan .

OTHER PUBLICATIONS

Williams et al., Monitoring Error-Correcting Circuits, IBM Technical Discl. Bulletin, vol. 10, No. 11, Apr. 1968, pp. 1800–1801.
Barshun et al., Self-Testing ECC Logic, IBM Tech. Discl. Bulletin, vol. 20, No. 7, Dec. 1977, pp. 2733–2744.
Testing Storage Parity Checking Logic, IBM Tech. Discl. Bulletin, vol. 28, No. 2, Jul. 1985, pp. 663–664.
Intel Corp., "Microsystem Components Handbook", Microprocessors and Peripherals vol. 11, 1985, pp. 5-39, 5-52, 5-87, 5-89 & 5-127.
Elecktronik 1980, Issue 26, pp. 58–60.
Elecktronik Informationen No. 1–1985, pp. 2, 34–36.

*Primary Examiner*—Charles E. Atkinson
*Attorney, Agent, or Firm*—Bernard, Rothwell & Brown

[57] ABSTRACT

In a storage unit equipped with a Reliablity, Availability and Serviceability (RAS) circuit, including a memory unit constructed of, e.g., a dynamic random access memory (DRAM) unit, for storing data with an error coding code (ECC), and an ECC unit constructed of e.g., an ECC checking circuit, for correcting a 1-bit error and detecting a 1-bit error, or more than 2-bit error contained in the data read from the memory unit, an ECC diagnostic unit is connected between said memory unit and said ECC unit, and an error made concerning the memory unit and ECC unit is diagnosed by the ECC diagnostic unit by selectively inverting the data read from the memory unit into diagnostic data during the checking operation of the ECC units to diagnose proper operation of the ECC unit and detect erros.

8 Claims, 8 Drawing Sheets

| (SW) TEST | DT | MDT | DESCRIPTION |
|---|---|---|---|
| OPEN | 0 | MD | WHEN THE TEST SWITCH IS OPENED, THE INPUT MD DIRECTLY CORRESPONDS TO THE OUTPUT MDT IRRESPECTIVE OF THE CONTENT OF THE INPUT DT. |
| | 1 | MD | |
| CLOSE (SHORT) | 0 | MD | WHEN THE CONTENT OF THE INPUT DT IS 0 EVEN WHEN THE TEST SWITCH IS CLOSED, THE INPUT MD DIRECTLY CORRESPONDS TO THE OUTPUT MDT. |
| | 1 | $\overline{MD}$ | THE INVERTED INPUT MD BECOMES THE OUTPUT MDT. |

MEMORY DEVICE EQUIPPED WITH A RAS CIRCUIT

BACKGROUND OF THE INVENTION

1. Field of the Invention

The present invention generally relates to a data processing apparatus including a memory unit with ECC (Error-Correcting Code). More particularly, the invention is directed to a storage device equipped with a RAS (Reliability, Availability, Serviceability) circuit for easily diagnosing operating conditions in the memory unit and an ECC checking circuit.

2. Description of the Prior Art

Figure 1:
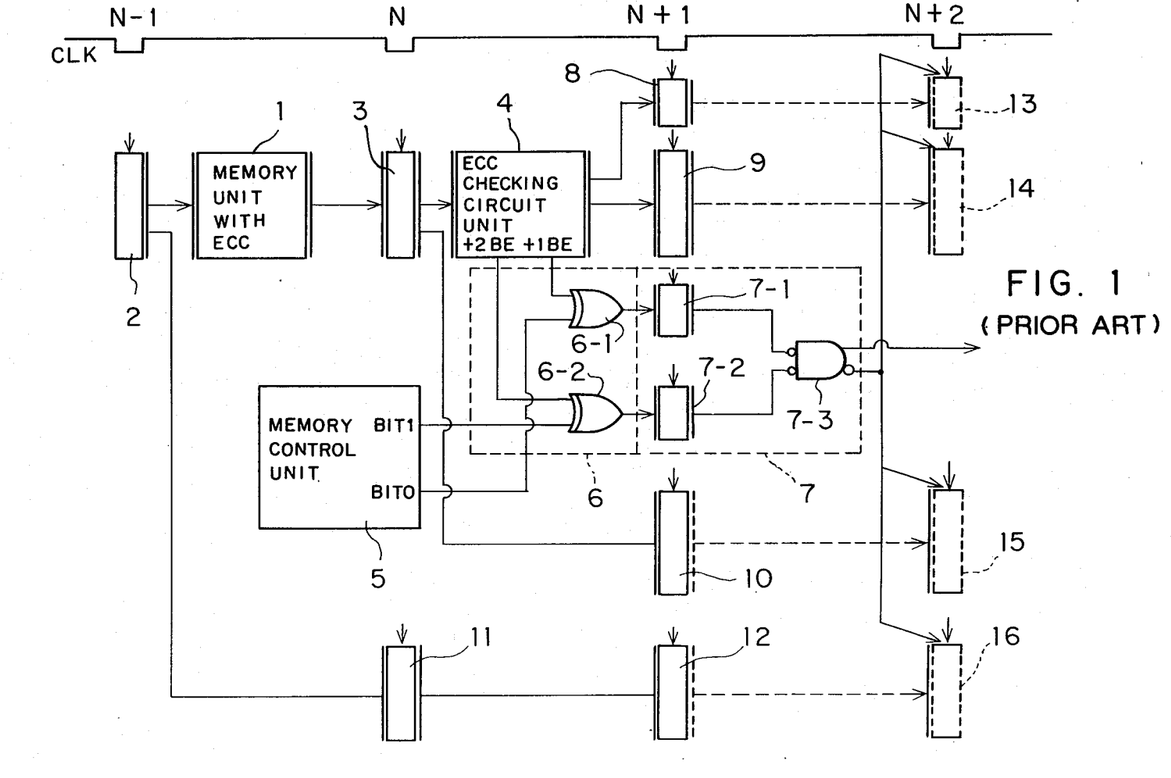
FIG. 1 is a block diagram of one conventional storage device equipped with a RAS circuit.

FIG. 1 is a circuit diagram of the conventional diagnostic system for the storage device disclosed, e.g., in Japanese patent publication No. 60-37934. In the drawing, reference numeral 1 indicates a memory unit, reference numeral 2 denotes an address register, reference numeral 3 represents an output data register, reference numeral 4 is an ECC (Error-Correcting Code) checking circuit unit, reference numeral 5 denotes a memory control unit, reference numeral 6 indicates an error detecting control unit, reference numeral 7 represents an error detecting unit, reference numeral 8 is a Hamming code register, and reference numeral 9 indicates a work register. Furthermore, reference numerals 10 to 12 indicate holding registers and reference numerals 13 through 16 represent detecting registers.

Operations of the prior art diagnostic system for storage devices will be described. The memory unit 1 stores various sorts of data utilized in the data processing apparatus. Error-correcting code (referred to as simply "ECC") is given to the data stored in the memory unit 1. The address register 2 functions in such a manner that addresses of the memory unit 1 are set, and several pieces of the data relating to the addresses set in the address register 2 are written into and read from the address register 2. The output register 3 temporarily stores the data read from the memory unit 1.

Figure 2:
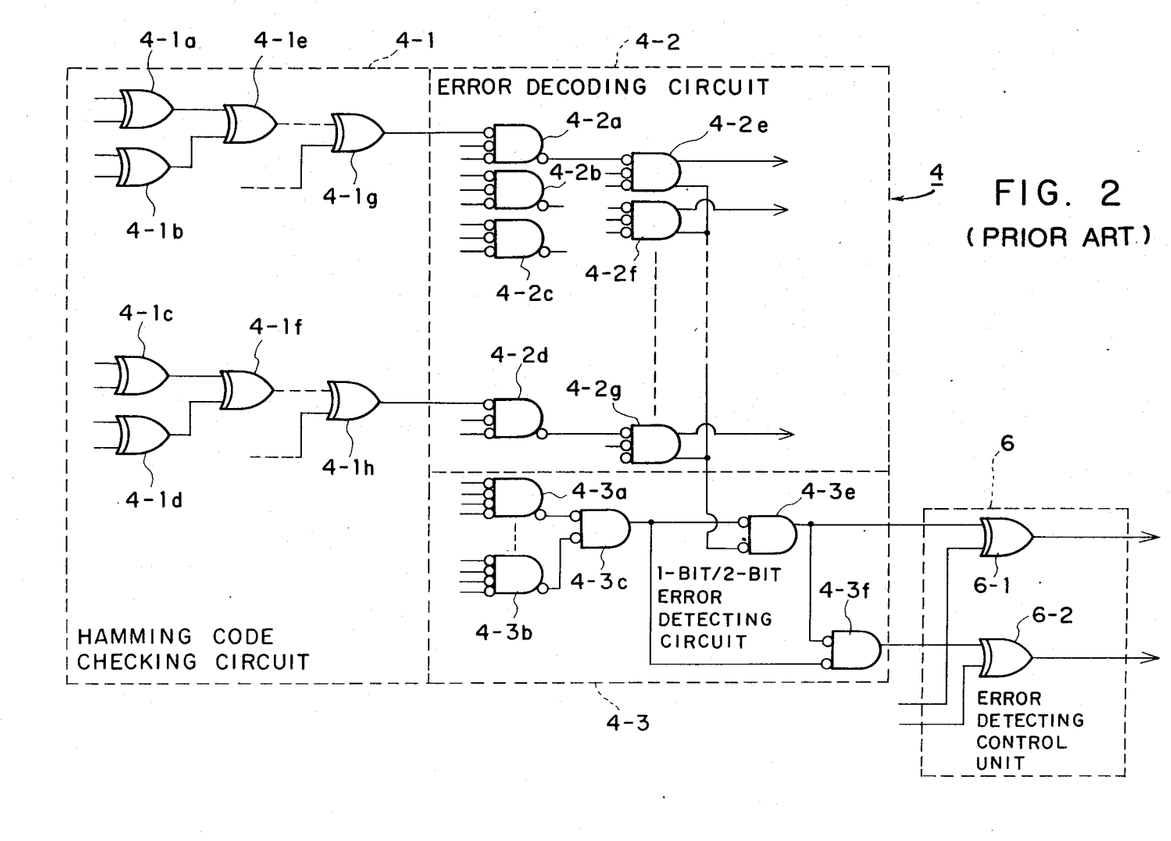
FIG. 2 is a circuit diagram of the major circuit of the ECC checking circuit of the storage device shown in FIG. 1.

The ECC checking circuit unit 4 firstly detects one(1)-bit error if one-bit error is contained in the data read from the memory unit 1, secondly corrects the above-described 1-bit error, and thirdly detects two-bit error when it is contained in the data. The ECC checking circuit unit 4 includes, as illustrated in FIG. 2, a Hamming code checking circuit 4-1, an error decoding circuit 4-2, and a 1-bit/2-bit error detecting circuit 4-3. These circuits are known in the art. The output data read from the memory unit 1 and then set in the output data register 3 is inputted to EOR (exclusive OR) circuits 4-1a, b, . . . , as illustrated in FIG. 2 to perform the normal Hamming code checking. Hamming code check outputs derived from these EOR circuits 4-1g and 4-1h are processed in OR circuits 4-2e, 4-2f, . . . . If there is the 1-bit error, then an error correcting code is calculated and transmitted to the error correcting circuit for performing error correction. The Hamming code check output is also inputted to the OR circuits 4-3a and 4-3b of the 1-bit/2-bit error detecting circuit 4-3. To an open collector OR circuit 4-3e of the 1-bit/2-bit error detecting circuit 4-3, outputs derived from the, open collector OR circuit 4-2e, 4-2f, . . . , 4-2g of the error decoding circuit 4-2 are supplied. The open collector OR circuit 4-3e outputs "1" when the 1-bit error is contained in the data, whereas open collector OR circuit 4-3f outputs "1" when the 2-bit error is contained therein.

The memory control unit 5 generates a 2-bit control signal is response to a test pattern stored in the memory unit 1 when the storage device is under diagnosis. The control signal "00" is produced from the memory control unit 5 when the normal test pattern containing no error is stored in the memory unit 1, the control signal "10" is derived therefrom when the 1-bit error pattern containing the 1-bit error is stored, and the control signal "01" is output therefrom in case that the 2-bit error pattern having the 2-bit error is stored therein.

The error detecting control unit 6, on the other hand, includes EOR (exclusive OR) circuits 6-1 and 6-2. The control unit 6 outputs "0" only when the ECC checking circuit 4 is under normal operation with respect to the diagnostic patterns stored in the memory unit 1 (will be described later). The error detecting unit 7 is constructed of latches 7-1 and 7-2, and an OR circuit 7-3, and outputs an error announcing signal in case that a signal representative of incorrect operation of the ECC checking circuit 4 is supplied from the error detecting control unit 6 thereto.

The Hamming check code derived from the above-described Hamming code checking circuit 4-1 is temporarily set in the Hamming code register 8. The work register 9 functions as a register for setting the conditions of the major part of the ECC checking circuit unit 4. The holding register 10 temporarily sets the output data from the output data register 3, whereas the holding registers 11 and 12 temporarily set the address data of the address register 2. The detecting registers 13 to 16 work as registers for temporarily setting contents of the respective Hamming code register 8, work register 9 and holding registers 10 and 12. Accordingly, the detecting registers 13 to 16 examine the contents of the respective detecting registers 13 to 16 to analyze the cause of the error when the error detecting signal is derived from the error detecting unit 7. The other prior art technique in this field will be described with reference to FIGS. 3 and 4.

Figure 3:
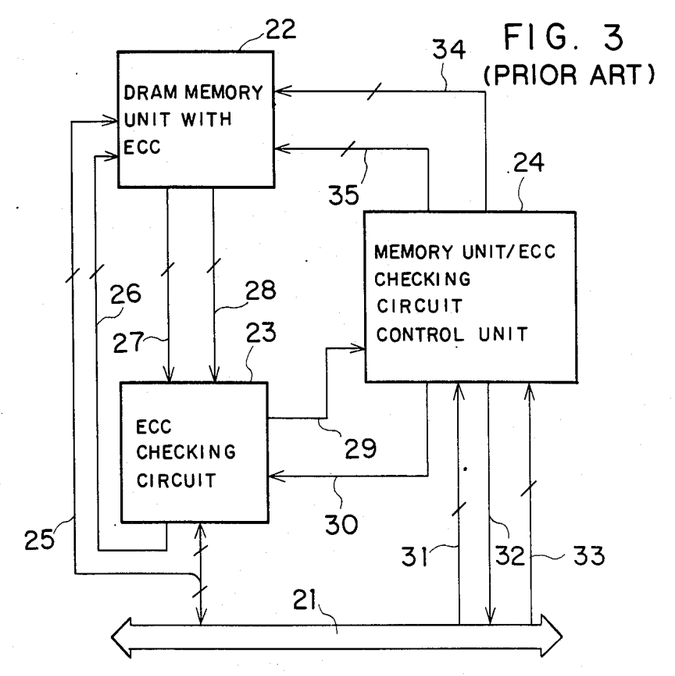
FIG. 3 is a block diagram of another conventional storage device equipped with a RAS circuit.

In FIG. 3, a storage device includes a bus 21, a DRAM (dynamic RAM) memory unit 22, and ECC checking circuit 23, a memory device/ECC circuit control unit 24, an input data line 25, a check-bit input data line 26, an output data line 27 for the DRAM memory unit, and a check-bit output data line 28. In this figure, reference numeral 29 represents a status signal for ECC checking circuit, reference numeral 30 indicates a control signal for ECC checking circuit, reference numeral 31 indicates an R(read)/W(write) signal, reference numeral 32 is a response signal, reference numeral 33 indicates an address line, reference numeral 34 denotes DRAM memory address line, and reference numeral 35 indicates an R/W signal for memory unit.

Figure 4:
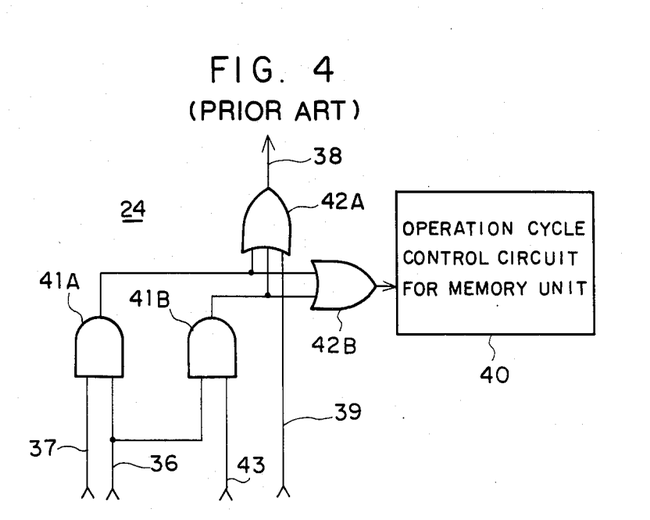
FIG. 4 is a circuit diagram of the major circuit of the ECC checking circuit of the storage device shown in FIG. 3.

FIG. 4 is an internal circuit diagram of the memory unit/checking circuit control unit 24 shown in FIG. 3. In the figure, reference numeral 36 represents a 1-bit error detecting signal 29 (a portion of the status signal for ECC checking circuit), reference numeral 37 indicates a status signal for a refresh operation, reference numeral 38 is a write signal for DRAM memory unit (corresponding to the write signal for memory unit R/W signal 35), reference numeral 39 represents a memory write signal (corresponding to the write signal for R/W signal 31), reference numeral 40 denotes an operation cycle control circuit for memory unit, reference numerals 41A and 41B indicate AND circuits, reference numerals 42A and 42B represent OR circuits, and furthermore, reference numeral 43 is a memory read signal (corresponding to the read signal for R/W signal 31).

Operations of the storage device shown in FIGS. 3 and 4 will now be described.

First, the data stored in the DRAM memory unit 22 is read in response to the read signal of the R/W signal 31 via the bus 21.

When the above-described read signal and address 33 are inputted into the memory unit/ECC checking circuit control unit 24 (equivalent to Intel's DRAM controller 8207), this control unit 24 transmits the memory unit R/W signal 35 and the DRAM memory unit address 34 to the DRAM memory unit 22 (with error-correcting code). As a result, the data which the address indicates is supplied to the ECC checking circuit 23 through the output data line 27 for DRAM memory unit 27 and the output data line 28 for check bit (ECC bit). Thereafter, the error detection on the input data is caried out by the ECC checking circuit 23 (equivalent to Intel's Error Detection and Correction unit 8206) by utilizing the check bit. If there is one-bit error contained in the input data, the status signal for ECC checking circuit 29 is transmitted to the memory unit/ECC checking circuit control unit 24, in which this one-bit error is corrected. Then, the error-corrected input data and the response signal 32 are transmitted to the bus 21. The memory unit/ECC checking circuit control unit 24 transmits the ECC checking circuit control signal 30 to the ECC checking circuit 23. Subsequently, the ECC checking circuit 23 produces the check bit for the correcting data and delivers this check bit to the check-bit input data line 26. The memory unit/ECC checking circuit control unit 24 also supplies the write signal 35 by which both the correcting data existing in the input data line 25 and the check bit data present in the check bit input data line 26 are written into corresponding addresses of DRAM memory unit 22. The operation of this storage device is accomplished when the writing of the data is completed.

When the 1-bit error is not contained, then the data is transmitted to the bus 21.

As previously described, since a DRAM (dynamic RAM) element is employed as the memory unit in the DRAM memory unit 22, this memory element must be refreshed. The aim of the refreshing is to prevent the data stored in the memory unit from being depleted. In the refresh cycle of the memory unit, row address (RA) and column address (CA) are produced. Accordingly, the memory unit can be read. In case of memory capacity; of 2 Mbytes several tens of seconds are required to read the entire memory region within the refresh cycle. It is, of course, to correct the data and also to re-write it when the 1-bit error is contained in the data during the reading operation.

The theory of the write signal generation in case of the 1-bit error will now be described. When the DRAM element is refreshed, both the refreshing status signal 37 and the 1-bit error detecting signal 36 are supplied to the AND circuit 41a. If the 1-bit error is detected, the output signal of the AND circuit 41A is input to the OR circuits 42A and 42B, so that the write signal 38 for DRAM memory unit is generated and the internal operation cycle is prolonged by the operation cycle control circuit for memory unit 40.

During the reading operation, both the memory read signal 43 and the 1-bit error detecting signal 36 are inputted to the AND circuit 41B. The output of the AND circuit 41B is supplied to the OR circuits 42A and 42B when the 1-bit error occurs, with the result that the write signal for DRAM memory unit 38 is generated and the internal operation cycle is prolonged by the operation cycle control circuit for memory unit 40.

During the writing operation, the memory write signal is inputted into the OR circuit 42A so that the write signal 38 may be generated. The contents and operation of the above-mentioned microprocessor are disclosed, for example, in "Microsystem Components Handbook Microprocessors and Peripherals Vol. II (published by Intel, Santa Clara, Calif.)".

The following drawbacks are however involved in the above-described conventional storage devices.

In the first conventional storage device shown in FIGS. 1 and 2, when the 1-bit error diagnostic data is processed, the ECC checking circuit is operated under the normal condition even if one bit data other than the 1-bit error diagnostic data is detected by this checking circuit. Since the diagnostic data is once written in the memory unit and then is read for diagnosing the ECC checking circuit, this memory unit must be operated in the normal condition.

Moreover, upon occurrence of the bit error the storage device must be diagnosed, so that the overall system is necessarily interrupted every time the bit error occurs, and thus, the operating efficiency of the overall system is lowered.

Also in the second conventional storage device shown in FIGS. 3 and 4, if the 1-bit error occurs when the continuous reading operation of the memory unit is performed, the data is re-written after it has been corrected. As a result, the processing speed of the storage device is not only lowered considerably, but also complex control logic is required for the rewrite operation.

SUMMARY OF THE INVENTION

An object of the present invention is to provide a storage device equipped with an RAS circuit wherein when particularly, the ECC checking circuit is diagnosed, diagnostic incorrect data is inputted into the ECC checking circuit by a diagnostic data inverting unit for simultaneously inverting one bit or plural bit data, and confirmation can be made whether the error detection intended by the ECC checking circuit is effected with respect to the diagnostic data together with the error information sent from the ECC checking circuit when one bit error occurs.

Another object of the invention is to provide a storage device equipped with a RAS circuit wherein the circuit arrangement is designed to improve the operating efficiency of the overall system, and discrimination can be made whether the, memory element has failed, or the ECC function has failed.

Still another object of the invention is to provide a storage device equipped with a RAS circuit wherein since only the data correction is performed even if one bit error occurs during the reading operation, the continuous processing speed can be improved, and because the logic function for the rewriting operation is omitted, hardware capacity can be reduced.

To achieve the above-described objects, the storage device equipped with the RAS circuit according to the invention has the following characteristic. One bit or plural bit data is freely inverted in any bit data of a memory unit in order to analyze the change of data, and then the data is read. When the ECC is checked an error detection is made, for a syndrome code output from the ECC checking circuit which bit within the data width corresponds to the error is decoded; discrimination is made by employing an ECC function/memory element diagnostic unit whether the entire system is operable in the normal condition, the memory element has failed, or the ECC function has failed; and the rewriting operation is interrupted when the 1-bit error occurs during the reading operation, as well as the rewriting operation is performed only when the 1-bit error occurs during the refreshing operation.

DETAILED DESCRIPTION OF THE PREFERRED EMBODIMENT

A description will now be made of various types of preferred embodiments of a storage device equipped with a RAS (reliability availability serviceability) circuit with reference to the drawings.

Figure 5:
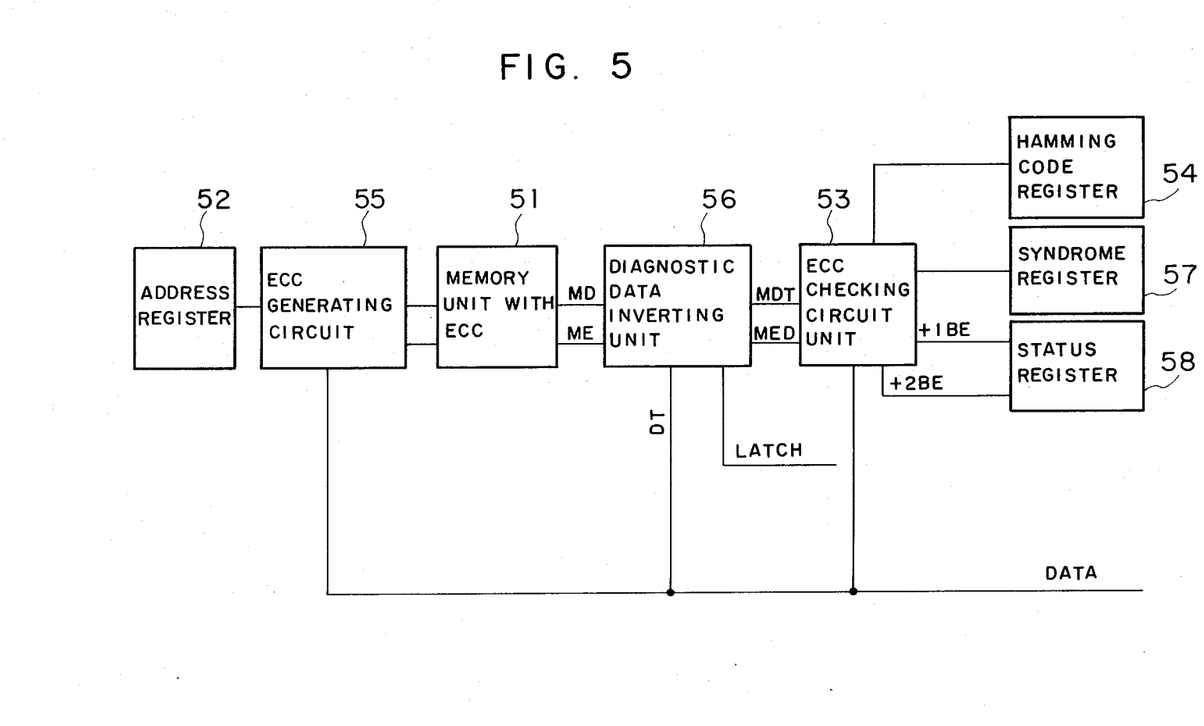
FIG. 5 is a block diagram of a storage device according to a first preferred embodiment of the invention.
Figure 6:
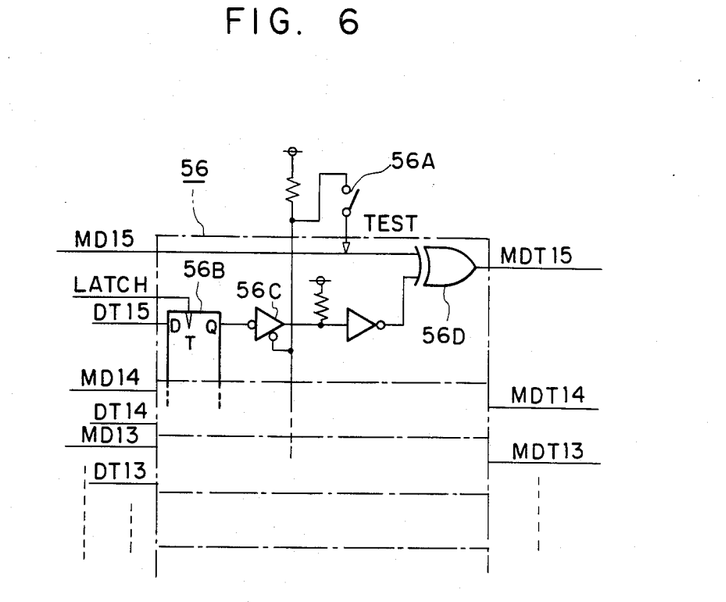
FIG. 6 is a block diagram of a detailed circuit of a diagnostic data inverting unit shown in FIG. 5.
Figure 7:
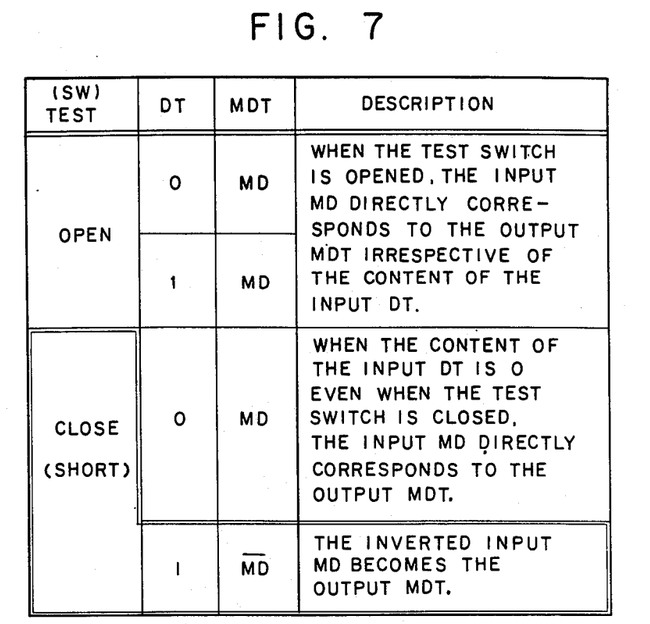
FIG. 7 is an illustration for explaining operations of the circuit shown in FIG. 6.

FIGS. 5 and 6 are schematic block diagrams of the storage device with the RAS circuit according to a first preferred embodiment, and FIG. 7 is an illustration for explaining operations of the storage device. In FIG. 5, the storage device comprises a memory device 51 having ECC (error-correcting code), an address register 52, an ECC checking circuit unit 53 and a Hamming code register 54, the circuit arrangement of which is very similar to that of the conventional storage device. Also, an ECC generating circuit 55 is provided between the memory unit 51 and the address register 52, whereas a diagnostic data inverting unit 56 is connected between the memory unit 51 and the ECC checking unit 53. The ECC checking unit 53 includes a syndrome register 57, and a status register 58 for +1BE (=1-bit error) information and +2BE (=2-bit error) information.

A detailed circuit arrangement of the diagnostic data inverting unit 56 will now be summarized with reference to FIG. 6. In the drawing, the diagnostic data inverting unit 56 is constructed of a TEST switch 56A, a DT input latch circuit 56B for latching the DT input in response to a LATCH signal, a validity selecting gate 56C for 56B-output, and an exclusive OR circuit 56D for receiving the MD input and DT input to output the MDT. The selecting gate 56C controls the validity of invalidity of the output from the DT input latch circuit 56B.

It should be noted that in the selecting gate 56C, the output of the DT input latch circuit 56B is valid when the TEST switch 56A is closed, whereas the output of the DT input latch circuit 56B is invalid when the TETT switch 56A is opened.

In FIG. 7, there is shown the status of the output MDT of the exclusive OR circuit 56D in response to the situations of the TEST switch 56A and the DT line.

Operations will now be described. The data is once inputted to the ECC generating circuit 55 in accordance with the addresses set by the address register 52 and the error-correcting code (ECC) is given to the input data. The input data having the error-correcting code is stored in the memory unit 51. Considering the normal data reading operation, the data reaches the diagnostic data inverting unit 56 from the memory unit 51. Since the TEST switch 56A remains open, the output of the memory unit 51 is directly input to the ECC checking circuit 53 for checking the error-correcting code of the input data. The ECC checking circuit 53 generates +1BE signal and simultaneously correcting data in case of occurrence of the 1-bit error. When the 2-bit error occurs, the ECC checking circuit unit 53 generates +2BE signal and also the data without any correction.

Now considering the diagnosis of the ECC checking circuit 53, the data reaches the diagnostic data inverting unit 56 from the memory unit 51. At this stage, the TEST switch 56A is closed. The input DT is inverted into "1" by one bit, and then latched in the DT input latch circuit 56B. As a result, only the input data bit of the ECC checking circuit unit 53 corresponding to the above one bit becomes the inverted output data of the memory unit 51 (if the data bit is "1", then the output data is "0", and vice versa). In accordance with such operations, the ECC checking circuit unit 53 detects the 1-bit error and generates the correcting data while producing +1BE signal. In addition, the ECC checking circuit unit 53 generates the Hamming code and syndrome code. These Hamming code and syndrome code are stored in the Hamming code register 54 and the syndrome code register 57 respectively. Under this condition, recognition can be made in that the ECC checking circuit unit 53 detects which bit data is incorrect, taking account of the above information.

The ECC checking circuit unit 53 performs the checking operation for more than 2-bit error similar to that of the 1-bit error. Thereafter, it detects the 2-bit error and generates +2BE signal. FIG. 7 represents operation conditions of the MDT output signal when the TEST switch 56A is turned on and off in the circuit of FIG. 6.

In the above preferred embodiment, the TEST switch 56A was illustrated by means of hardware, but may be realized by utilizing a signal latched by the register under the control of software.

Moreover, the input signal of the output validity selecting gate 56C of the DT input latch circuit 56B was used as the DT signal latched by the DT input latch circuit 56B in the previous embodiment. The signal may be directly inputted into the selecting gate 56C by means of hardware, e.g., a switch.

Figure 8:
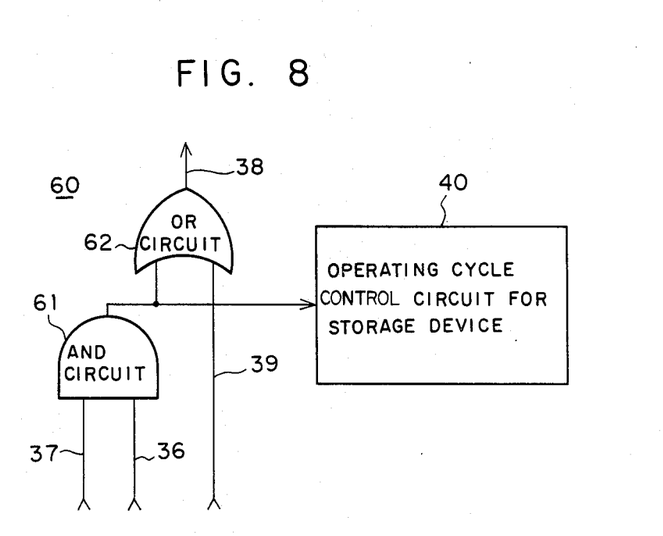
FIG. 8 is a block diagram for explaining a memory unit/ECC checking circuit unit according to a second preferred embodiment of the invention.

Referring now to FIG. 8, a second preferred embodiment will be described.

Some improvements have be achieved in the conventional storage devices shown in FIGS. 3 and 4.

In FIG. 8, since reference numerals 36 to 40 indicate the same or similar circuit elements of FIG. 4, no further detailed description is made. In the drawing, a memory unit/ECC checking circuit control unit 60 includes an AND circuit 61 and an OR circuit 62.

This second preferred embodiment is operated as follows.

According to the prior art device as shown in FIG. 3, the 1-bit error data correction is performed when the 1-bit error is detected by the ECC checking circuit 23 during the reading operation. In the second preferred embodiment, this correcting data is not rewritten into the memory unit that is a feature of the second embodiment. Other operations are the same as the conventional storage device.

That is to say, during the refreshing operation, the refreshing status signal 37 and the 1-bit error detecting signal 36 are inputted into the AND circuit 61. In case of occurrence of the 1-bit error, the output of the AND circuit 61 is supplied to the operating cycle control circuit for storage device 40 and the OR circuit 62. Upon receipt of the input from the AND circuit 61, the operating cycle control circuit 40 enables the internal cycle for writing the correcting data to be lengthened. The OR circuit 62 generates a DRAM memory unit write signal 38 to write the correcting data. Also, during the writing operation, a memory write signal 39 is inputted to the OR circuit 62 which generates the DRAM memory unit write signal 38.

In the preferred embodiment, attention is given to a fact that the refreshing operation is necessarily required when employing a DRAM (dynamic random access memory) element. That is to say, the row address (RA) and column address (CA) are supplied to the memory unit (memory capacity: 2 Mbytes) during the refreshing cycle, so that the reading operation is executed with respect to the corresponding addresses. Accordingly, the reading operation with respect to the entire memory region of the memory unit can be accomplished within several tens of seconds by utilizing the refreshing operation. If the 1-bit error occurs due to the reading operation in the refreshing cycle, the data in question is corrected and thereafter rewritten in the read address.

As a result, a correction on the 1-bit error can be completed in the memory unit within several tens of seconds. The major object of the application of the ECC (error-correcting code) bit is to avoid software errors of a memory element. According to the latest technical data, the present software error rate per one piece of a memory element is on the order of 550 Fit (256K DRAM). Then, even if 100 pieces of the memory element are employed, probability of occurrence of a 1-bit error is considerably low, e.g., approximately one time per two years. That is to say, the 1-bit error may occur in an arbitrary time within two years.

As a result of improvements in element's performance, the 1-bit error detection may be effected only in the refreshing cycle and the data may be corrected for the rewriting operation.

It should be noted that the similar advantages may be obtained when the memory unit is sub-divided into a plurality of memory regions. That is to say, the similar merits can be achieved in such a storage device where one sub-divided memory region is read in the refreshing cycle, and the remaining memory regions are RAS-only-refreshed.

Figure 9:
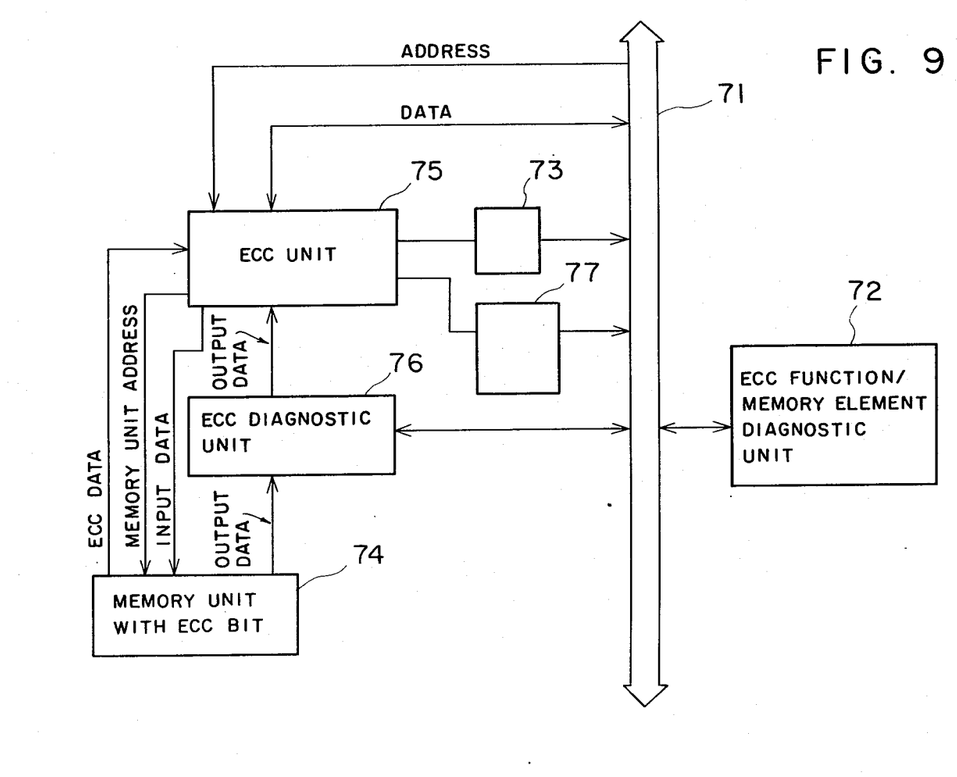
FIG. 9 is a block diagram of a storage device equipped with a RAS circuit according to a third preferred embodiment.
Figure 10:
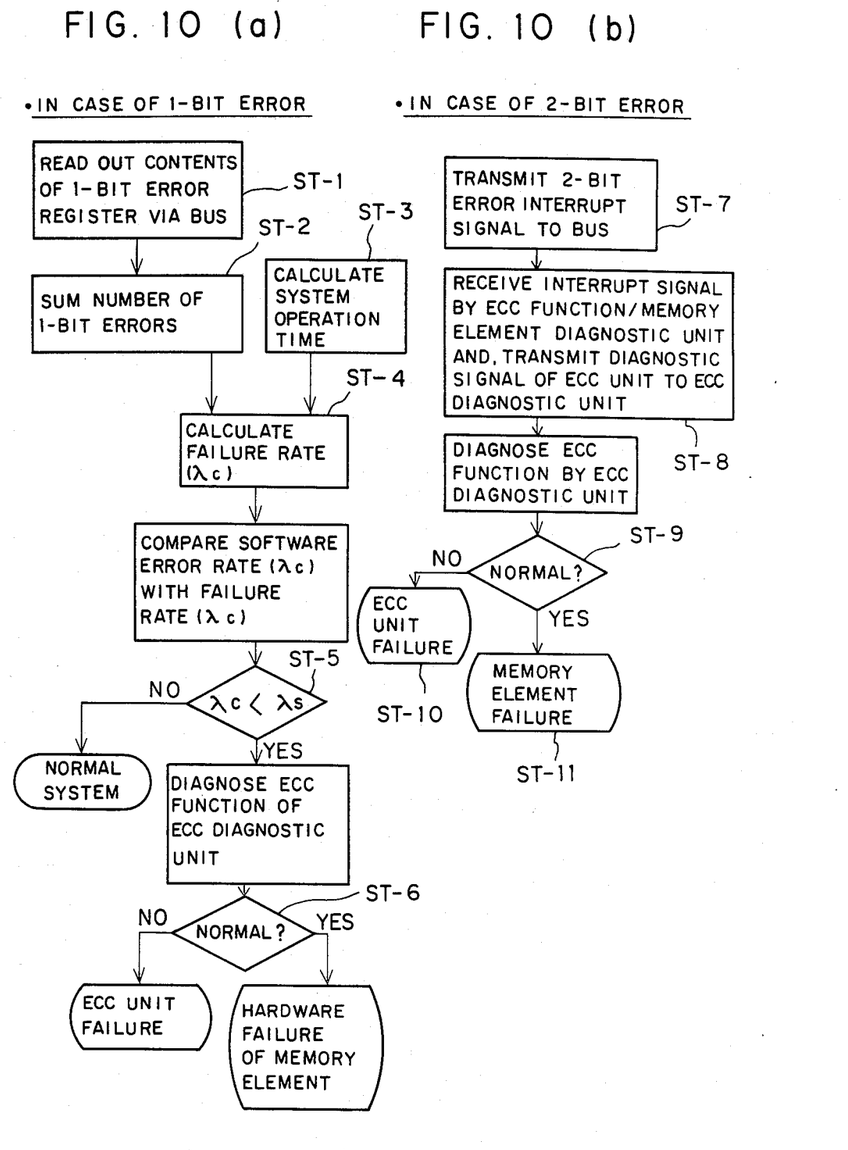
FIGS. 10a and 10b show flowcharts for explaining operations of the storage device shown in FIG. 9.

Referring to FIGS. 9 and 10, a storage device equipped with a RAS circuit according to a third preferred embodiment will now be described.

In FIG. 9, reference numeral 71 indicates a bus for transmitting information, reference numeral 72 represents an ECC function/memory element diagnostic unit, reference numeral 73 denotes a 1-bit error register, reference numeral 74 indicates a memory unit with ECC bit, reference numeral 75 is an ECC unit, reference numeral 76 represents an ECC diagnostic unit, and reference numeral 77 indicates a 2-bit error status signal generator.

In FIGS. 10(a) and 10(b), there are shown flowcharts to explain operations of this third preferred embodiment.

When the 1-bit error occurs, the ECC function/memory element diagnostic unit 72 starts to read at a predetermined periodic cycle contents of the 1-bit error register 73 of the storage device via the bus 71, as shown in the flowchart of FIG. 10(a) (step ST-1). In the next step (ST-2), the number of the 1-bit errors, is summed. Thereafter, a failure rate "$\lambda_c$" is calculated is step ST-4 from an accumulated value of the system operation time (step ST-3) as well as the summed number of the 1-bit errors (step ST-2). In the succeeding step (ST-5), a software error rate $\lambda_s$) of the memory unit is compared with the above failure rate $\lambda_c$) If the software error rate ($\lambda_s$) is greater than the failure rate ($\lambda_c$), the ECC function/memory element diagnostic unit 72 sends commands to the ECC diagnostic unit 76 and then a judgement is made of the function of the ECC unit 75 of the memory unit (step ST-6).

For instance, the ECC diagnostic unit 76 has a function for diagnosing the data written in the storage device (a first preferred embodiment) equipped with the RAS circuit, whereas the ECC unit 75 holds a function to diagnose the data written in the storage device (a second preferred embodiment) equipped with the RAS circuit. Specifically, the ECC diagnostic unit 76 compulsorily inverts a 1-bit or 2-bit of the output data of the memory unit 74 which is inputted to the ECC unit 75. This ECC unit 75 generates the Hamming code and syndrome code; corrects the data 1-bit error; rewrites the correcting data; and detects more than 2-bit errors.

Then, contents of the Hamming code and syndrome code calculated from the ECC unit 75, contents of the data, and contents of the 1-bit error as well as the 2-bit error are diagnosed in such a manner that the functions of ECC 1-bit error correction, 2-bit error detection, and generation of the Hamming code and also the syndrome code are confirmed, with the result that diagnosis is made whether the ECC unit 75 is normal or extraordinary.

Accordingly, if the ECC unit 75 is normal, then the hardware failure of the memory element occurs. Otherwise, the ECC unit 75 may fail.

When the 2-bit error occurs, an interrupt signal is transmitted, as shown in FIG. 10(b), via the bus 71 to the ECC function/memory element diagnostic unit 72 (step ST-7). Thereafter, this ECC function/memory element diagnostic unit 72 requires the ECC diagnostic unit 76 to diagnose the ECC unit 75 (step ST-8). Then, it is judged whether the ECC unit 75 is normal or not (step ST-9). The diagnostic method of this 2-bit error is the same as that of the 1-bit error. In this flowchart shown in FIG. 10(b), if the diagnostic result is normal, then the hardware of the memory element may fail (step ST-11). That is to say, because the 2-bit error is equal to the failure of the common code, and the probability on occurrence of the 2-bit error is very low, compared with that of the 1-bit error, such situation should be regarded as the memory hardware failure.

The software error rate, on the other hand, represents a random failure rate, as an inherent error belonging to a memory element, which occurs from the memory element production stage. This error may be influenced by the alpha ray contained in the memory materials. In other words, the rate of this error becomes constant at any arbitrary time.

It is apparent that the ECC function/memory element diagnostic unit 72 may be arranged by means of hardware and software.

Moreover, instead of the 1-bit error register, a 1-bit error counter may be employed, and the 2-bit error status signal generator may be substituted by a 2-bit error register.

While the invention has been described with reference to the specific embodiment, the diagnostic data inverting unit is provided between the output of the memory unit and the ECC checking circuit. Accordingly, no writing time is required when the data is written into the memory unit during the diagnostic mode. Moreover, since the bit number as well as the bit position of the data can be freely modified for diagnostic purposes once a bit error occurs, the RAS circuit of the storage device with a higher efficiency and a higher function can be realized.

In accordance with the present invention, the ECC function/memory element diagnostic unit is employed to diagnose failures of the data processing system having the memory unit and then a failure judgement criterion can be established, whereby a judgement can be made, based upon this criterion, whether the hardware of the memory element, or the ECC unit may fail. Consequently, unwanted system down phenomenon can be avoided and therefore the system operating rate can be considerably improved.

In addition, since no rewriting operation of the data is performed during the reading operation even if the 1-bit error occurs, the data processing speed by the storage device can be maintained at a higher rate, and the amount, of the hardware can be reduced, resulting in a low-cost storage device.

What is claimed is:

1. A storage device equipped with a reliability, availability and serviceability (referred to as "RAS") circuit, having a memory unit for storing data to which an error-correcting code (referred to as "ECC") has been applied, and an ECC checking circuit for detecting 1-bit, or more than 2-bit error contained in data read from the memory unit, characterized by comprising:
   a diagnostic data inverting unit connected between said memory unit and said ECC checking circuit for diagnosing an error mode with respect to said ECC checking circuit and said memory unit by inverting into diagnostic data the data being read from said memory unit during the checking operation by said ECC checking circuit wherein said diagnostic data inverting unit includes:
   a test switch connected to said memory unit;
   a data input latch circuit for latching said data in response to a latch signal;
   a latch-output-validity selecting gate connected to said data input latch circuit for selectively controlling validity and invalidity of the output of asid data input latch circuit; and
   an exclusive OR circuit connected to receive a mode input and the output of said latch circuit for generating an OR-gated signal between the mode input and the data input.

2. A storage device equipped with a RAS circuit, including a memory unit for data with ECC, and an ECC checking circuit for detecting an error contained in the data read from said memory unit, and a memory unit/ECC checking circuit control unit for controlling said memory unit and said ECC checking circuit, characterized in that
   said memory unit is constructed of a dynamic random access memory (referred to as "DRAM") element;
   said DRAM memory unit delivers a refreshing status signal, by which reading operation is carried out during refreshing operation, to said memory unit/ECC checking circuit control unit;
   when a 1-bit error is detected by said ECC checking circuit from output data of said DRAM memory unit, correcting data is rewritten into corresponding address of said DRAM element, and only said 1-bit error is corrected during the reading operation other than said refreshing operation; and
   an operating cycle control circuit for the storage device is included in said memory unit/ECC checking circuit control unit, said refreshing status signal of said memory unit and a 1-bit error detection signal generated from said ECC checking circuit being input via an AND circuit into said operating cycle control circuit.

3. A storage device as claimed in claim 2, wherein said memory unit/ECC checking circuit control unit includes, other than said AND circuit and said operating cycle control circuit, an OR circuit for OR-gating the output of said AND circuit and a memory write signal during the writing operation on said DRAM memory unit to generate a write signal to said DRAM memory unit.

4. A storage device equipped with a RAS circuit comprising:
   a data bus for transmitting various data within the storage device;
   a memory unit for storing data with ECC;
   an ECC unit connected to said data bus via a 1-bit error register and a 2-bit and more bit error status signal generator, for correcting the errors in case of a 1-bit error and detecting the errors occurring in the storage device by selectively inverting 1-bit or more than 2-bit data of the output data of said memory unit to diagnose proper operation of said ECC unit and detect errors;
   an ECC diagnostic unit connected between said ECC unit and said memory unit, for diagnosing extraordinary outputs of said memory units by receiving the output data of said memory unit and for supplying results of said diagnosis to said ECC unit; and
   an ECC function/memory element diagnostic unit connected to said data bus, for diagnosing whether or not said ECC function of said ECC unit is malfunctioning and whether or not said memory element constituting said memory unit has failed by confirming various functions of the 1-bit error correction by said ECC unit, of the 2-bit error detection, of Hamming code generation and of syndrome code generation based upon the result of the diagnosis by said ECC diagnostic unit.

5. A storage device as claimed in claim 4, wherein said ECC function/memory element diagnostic unit includes:
- information reading means for reading information of said 1-bit error register connected between said ECC unit and said bus;
- measuring means connected to said 1-bit error register for accumulating the occurrence number of said 1-bit errors and for measuring system operation time;
- calculating means for calculating a failure rate in the system
- means for providing a preset software error rate of said memory element; and
- means for comparing the failure rate calculated by said calculation means with the preset software error rate of said memory element, whereby the system is diagnosed as a normal condition in case that the failure rate is smaller than the software error rate, whereas a judgement can be made whether said ECC unit is malfunctioning, or the hardware of said memory element has failed by diagnosing the function of said ECC unit by means of said ECC diagnostic unit when the failure rate is greater than the software error rate.

6. A storage device as claimed in claim 4, wherein ECC function/memory element diagnostic unit can diagnose whether the ECC unit is malfunctioning, or the memory element has failed under the condition that when 2-bit and more than 2-bit errors occur from said ECC unit, the signal from the 2-bit error status signal generator is received by said ECC function/memory element diagnostic unit.

7. A storage device as claimed in claim 4, wherein a 1-bit error counter is connected, instead of said 1-bit error register, between said data bus and said ECC unit.

8. A storage device as claimed in claim 4, wherein a 2-bit and more bit error register is connected, instead of said 2-bit and more bit status signal generator, between said data bus and said ECC unit.

* * * * *

UNITED STATES PATENT AND TRADEMARK OFFICE
CERTIFICATE OF CORRECTION

PATENT NO. : 4,794,597

DATED : December 27, 1988

INVENTOR(S) : Kunio Ooba et al.

It is certified that error appears in the above-identified patent and that said Letters Patent is hereby corrected as shown below:

```
    Front page, in the Abstract, line 12, after "and" insert
--the--;
                                    line 15, "units" should be
--unit--;
                                    line 16, "erros" should be
--errors--.
    Column 1, line 63, after "the" delete the ",".
    Column 2, line 2, "is" should be --in--;
              line 17, "OR" should be --OR--;
              line 57, delete the numeral "29";
              same line, after "signal" (second occurrence)
insert the numeral --29--.
    Column 3, line 19, "caried" should be --carried--;
              line 50, delete the ";".
    Column 4, line 52, after "the" delete the ",".
    Column 6, line 7, "TETT" should be --TEST--.
    Column 8, line 21, after "errors" delete the ",";
              line 22, "is" (second occurrence) should be --in--;
              line 27, after ")" insert --.--.
    Column 9, line 44, after "amount" delete the ",".
```

Signed and Sealed this

Twenty-sixth Day of December, 1989

*Attest:*

JEFFREY M. SAMUELS

*Attesting Officer*   *Acting Commissioner of Patents and Trademarks*